United States Patent
Lee et al.

(10) Patent No.: US 7,319,377 B2
(45) Date of Patent: Jan. 15, 2008

(54) METHOD FOR MAKING HIGH-PERFORMANCE RF INTEGRATED CIRCUITS

(75) Inventors: Jin-Yuan Lee, Hsin-Chu (TW); Mou Shiung Lin, Hsinchu (TW)

(73) Assignee: Megica Corporation, Hsin-Chu (TW)

( * ) Notice: Subject to any disclaimer, the term of this patent is extended or adjusted under 35 U.S.C. 154(b) by 0 days.

(21) Appl. No.: 10/856,377

(22) Filed: May 28, 2004

(65) Prior Publication Data

US 2004/0217840 A1 Nov. 4, 2004

Related U.S. Application Data

(62) Division of application No. 09/945,436, filed on Sep. 4, 2001, now Pat. No. 6,759,275.

(51) Int. Cl.
*H01F 5/00* (2006.01)

(52) U.S. Cl. .................................................. 336/200

(58) Field of Classification Search ................. 336/83, 336/200, 206–208, 232; 257/531–539; 438/106, 438/381
See application file for complete search history.

(56) References Cited

U.S. PATENT DOCUMENTS

| | | | | |
|---|---|---|---|---|
| 4,606,998 A * | 8/1986 | Clodgo et al. | ............... | 430/312 |
| 5,387,551 A | 2/1995 | Mizoguchi et al. | .......... | 437/209 |
| 5,904,546 A | 5/1999 | Wood et al. | ................ | 438/460 |
| 5,929,508 A * | 7/1999 | Delgado et al. | ............ | 257/617 |
| 6,043,109 A | 3/2000 | Yang et al. | ................. | 438/113 |
| 6,046,101 A | 4/2000 | Dass et al. | ................... | 438/624 |
| 6,169,320 B1 * | 1/2001 | Stacey | ......................... | 257/531 |
| 6,258,652 B1 * | 7/2001 | Stacey | ......................... | 438/238 |
| 6,455,885 B1 * | 9/2002 | Lin | ............................ | 257/300 |
| 6,790,751 B2 * | 9/2004 | Tsuruta et al. | ............. | 438/524 |
| 2003/0067014 A1 * | 4/2003 | Tsuruta et al. | ............. | 257/200 |
| 2003/0160301 A1 * | 8/2003 | Furukawa et al. | ......... | 257/539 |
| 2004/0029404 A1 * | 2/2004 | Lin | ............................ | 438/958 |

* cited by examiner

*Primary Examiner*—Tuyen T. Nguyen
(74) *Attorney, Agent, or Firm*—Saile Ackerman LLC; Stephen B. Ackerman; Rosemary L. S. Pike

(57) ABSTRACT

A new method and structure is provided for the creation of a semiconductor inductor. Under the first embodiment of the invention, a semiconductor substrate is provided with a scribe line in a passive surface region and active circuits surrounding the passive region. At least one bond pad is created on the passive surface of the substrate close to and on each side of the scribe line. A layer of insulation is deposited, a layer of dielectric is deposited over the layer of insulation, at least one bond pad is provided on the surface of the layer of dielectric on each side of the scribe line. At least one inductor is created on each side of the scribe line on the surface of the layer of dielectric. A layer of passivation is deposited over the layer of dielectric. The substrate is attached to a glass panel by interfacing the surface of the layer of passivation with the glass panel. The substrate is sawed from the backside of the substrate in alignment with the scribe line. The silicon that remains in place in the passive surface of the substrate underneath the scribe lines is removed by etching, the glass panel is separated along the scribe line. Under the second embodiment of the invention, the inductor is created on the surface of a thick layer of polymer that is deposited over the layer of passivation.

18 Claims, 5 Drawing Sheets

METHOD FOR MAKING HIGH-PERFORMANCE RF INTEGRATED CIRCUITS

This is a division of U.S. patent application Ser. No. 09/945,436, filing date Sep. 4, 2001, now U.S. Pat. No. 6,759,275 Method For Making High-Performance Rf Integrated Circuits, assigned to the same assignee as the present invention, which is herein incorporated by reference in its entirety.

BACKGROUND OF THE INVENTION (1) Field of the Invention

The invention relates to the manufacturing of high performance Integrated Circuit (IC's), and, more specifically, to methods of creating a high performance electrical inductor on the surface of a semiconductor substrate by reducing the electromagnetic losses that are typically incurred in the surface of the substrate.

(2) Description of the Prior Art

The continued emphasis in the semiconductor technology is to create improved performance semiconductor devices at competitive prices. This emphasis over the years has resulted in extreme miniaturization of semiconductor devices, made possible by continued advances of semiconductor processes and materials in combination with new and sophisticated device designs. Most of the semiconductor devices that are at this time being created are aimed at processing digital data. There are however also numerous semiconductor designs that are aimed at incorporating analog functions into devices-that simultaneously process digital and analog data, or devices that can be used for the processing of only analog data. One of the major challenges in the creation of analog processing circuitry (using digital processing procedures and equipment) is that a number of the components that are used for analog circuitry are large in size and can therefore not readily be integrated into devices that typically have feature sizes approaching the sub-micron range. The main components that offer a challenge in this respect are capacitors and inductors, since both these components are, for many analog processing circuits, of considerable size.

A typical application for inductors of the invention is in the field of modern mobile communication applications that make use of compact, high frequency equipment. Continued improvements in the performance characteristics of this equipment has over the years been achieved, further improvements will place continued emphasis on lowering the power consumption of the equipment, on reducing the size of the equipment, on increasing the operational frequency of the applications and on creating low noise levels. One of the main applications of semiconductor devices in the field of mobile communication is the creation of Radio Frequency (RF) amplifiers. RF amplifiers contain a number of standard components, a major component of a typical RF amplifier is a tuned circuit-that contains inductive and capacitive components. Tuned circuits form, dependent on and determined by the values of their inductive and capacitive components, an impedance that is frequency dependent, enabling the tuned circuit to either present a high or a low impedance for signals of a certain frequency. The tuned circuit can therefore either reject or pass and further amplify components of an analog signal, based on the frequency of that component. The tuned circuit can in this manner be used as a filter to filter out or remove signals of certain frequencies or to remove noise from a circuit configuration that is aimed at processing analog signals. The tuned circuit can also be used to form a high electrical impedance by using the LC resonance of the circuit and to thereby counteract the effects of parasitic capacitances that are part of a circuit. One of the problems that is encountered when creating an inductor on the surface of a semiconductor substrate is that the self-resonance that is caused by the parasitic capacitance between the (spiral) inductor and the underlying substrate will limit the use of the inductor at high frequencies. As part of the design of such an inductor it is therefore of importance to reduce the capacitive coupling between the created inductor and the underlying substrate.

At high frequencies, the electromagnetic field that is generated by the inductor induces eddy currents in the underlying silicon substrate. Since the silicon substrate is a resistive conductor, the eddy currents will consume electromagnetic energy resulting in significant energy loss, resulting in a low Q inductor. This is the main reason for a low Q value of an inductor, whereby the resonant frequency of $1/\sqrt{(LC)}$ limits the upper boundary of the frequency. In addition, the eddy currents that are induced by the inductor will interfere with the performance of circuitry that is in close physical proximity to the inductor.

It has already been pointed out that one of the key components that are used in creating high frequency analog semiconductor devices is the inductor that forms part of an LC resonance circuit. In view of the high device density that is typically encountered in semiconductor devices and the therefrom following intense use of the substrate surface area, the creation of the-inductor must incorporate the minimization of the surface area that is required for the inductor while at the same time maintaining a high Q value for the inductor. Typically, inductors that are created on the surface of a substrate are of a spiral shape, whereby the spiral is created in a plane that is parallel with the plane of the surface of the substrate. Conventional methods that are used to create the inductor on the surface of a substrate suffer several limitations. Most high Q inductors form part of a hybrid device configuration or of Monolithic Microwave Integrated Circuits (MMIC's) or are created as discrete components, the creation of which is not readily integratable into a typical process of Integrated Circuit manufacturing. It is clear that, by combining the creation on one semiconductor monolithic substrate of circuitry that is aimed at the functions of analog data manipulation and analog data storage with the functions of digital data manipulation and digital data storage, a number of significant advantages can be achieved. Such advantages include the reduction of manufacturing costs and the reduction of power consumption by the combined functions. The spiral form of the inductor that is created on the surface of a semiconductor substrate however results, due to the physical size of the inductor, in parasitic capacitances between the inductor wiring and the underlying substrate and causes electromagnetic energy losses in the underlying resistive silicon substrate. These parasitic capacitances have a serious negative effect on the functionality of the created LC circuit by sharply reducing the frequency of resonance of the tuned circuit of the application. More seriously, the inductor-generated electromagnetic field will induce eddy currents in the underlying resistive silicon substrate, causing a significant energy loss that results in low Q inductors.

The performance parameter of an inductor is typically indicated is the Quality (Q) factor of the inductor. The quality factor Q of an inductor is defined as $Q=Es/El$, wherein Es is the energy that is stored in the reactive portion of the component while El is the energy that is lost in the reactive portion of the component. The higher the quality of the component, the closer the resistive value of the component approaches zero while the Q factor of the component approaches infinity. For inductors that are created overlying a silicon substrate, the electromagnetic energy that is created by the inductor will primarily be lost in the resistive silicon of the underlying substrate and in the metal lines that are created to form the inductor. The quality factor for components differs from the quality that is associated with filters or resonators. For components, the quality factor serves as a measure of the purity of the reactance (or the susceptance) of the component, which can be degraded due to the resistive silicon substrate, the resistance of the metal lines and dielectric losses. In an actual configuration, there are always some physical resistors that will dissipate power, thereby decreasing the power that can be recovered. The quality factor Q is dimensionless. A Q value of greater than 100 is considered very high for discrete inductors that are mounted on the surface of Printed Circuit Boards. For inductors that form part of an integrated circuit, the Q value is typically in the range between about 3 and 10.

In creating an inductor on a monolithic substrate on which additional semiconductor devices are created, the parasitic capacitances that occur as part of this creation limit the upper bound of the cut-off frequency that can be achieved for the inductor using conventional silicon processes. This limitation is, for many applications, not acceptable. Dependent on the frequency at which the LC circuit is designed to resonate, significantly larger values of quality factor, such as for instance 50 or more, must be available. Prior Art has in this been limited to creating values of higher quality factors as separate units, and in integrating these separate units with the surrounding device functions. This negates the advantages that can be obtained when using the monolithic construction of creating both the inductor and the surrounding devices on one and the same semiconductor substrate. The non-monolithic approach also has the disadvantage that additional wiring is required to interconnect the sub-components of the assembly, thereby again introducing additional parasitic capacitances and resistive losses over the interconnecting wiring network. For many of the applications of a RF amplifier, such as portable battery powered applications, power consumption is at a premium and must therefore be as low as possible. By raising the power consumption, the effects of parasitic capacitances and resistive power loss can be partially compensated, but there are limitations to even this approach. These problems take on even greater urgency with the rapid expansion of wireless applications, such as portable telephones and the like. Wireless communication is a rapidly expanding market, where the integration of RF integrated circuits is one of the most important challenges. One of the approaches is to significantly increase the frequency of operation to for instance the range of 10 to 100 GHz. For such high frequencies, the value of the quality factor obtained from silicon-based inductors is significantly degraded. For applications in this frequency range, monolithic inductors have been researched using other than silicon as the base for the creation of the inductors. Such monolithic inductors have for instance been created using sapphire or GaAs as a base. These inductors have considerably lower substrate losses than their silicon counterparts (no eddy current, hence no loss of electromagnetic energy) and therefore provide much higher Q inductors. Furthermore, they have lower parasitic capacitance and therefore provide higher frequency operation capabilities. Where however more complex applications are required, the need still exists to create inductors using silicon as a substrate. For those applications, the approach of using a base material other than silicon has proven to be too cumbersome while for instance GaAs as a medium for the creation of semiconductor devices is as yet a technical challenge that needs to be addressed. It is known that GaAs is a semi-insulating material at high frequencies, reducing the electromagnetic losses that are incurred in the surface of the GaAs substrate, thereby increasing the Q value of the inductor created on the GaAs surface. GaAs RF chips however are expensive, a process that can avoid the use of GaAs RF chips therefore offers the benefit of cost advantage.

When the geometric dimensions of the Integrated Circuits are scaled down, the cost per die is decreased while some aspects of performance are improved. The metal connections which connect the Integrated Circuit to other circuit or system components become of relative more importance and have, with the further miniaturization of the IC, an increasingly negative impact on circuit performance. The parasitic capacitance and resistance of the metal interconnections increase, which degrades the chip performance significantly. Of most concern in this respect is the voltage drop along the power and ground buses and the RC delay of the critical signal paths. Attempts to reduce the resistance by using wider metal lines result in higher capacitance of these wires.

Current techniques for building an inductor on the surface of a semiconductor substrate use fine-line techniques whereby the inductor is created under a layer of passivation. This however implies close physical proximity between the created inductor and the surface of the substrate over which the inductor has been created (typically less than 10 µm), resulting in high electro-magnetic losses in the silicon substrate which in turn results in reducing the Q value of the inductor. By removing silicon of the silicon surface over which the inductor has been created, the electromagnetic losses that are typically incurred in the silicon substrate will be reduced and the Q value of the inductor can be increased. The process of the invention applies this principle of silicon removal underneath the created inductor, thereby increasing the Q value of the created inductor.

U.S. Pat. No. 5,904,546 (Wood et al.) shows a dicing process on scribe lines to form planar inductors. However, this reference differs from the invention.

U.S. Pat. No. 6,046,101 (Dass et al.) shows a process where passivation is not formed over some scribe streets.

U.S. Pat. No. 6,043,109 (Yang et al.) discloses a IC process (including inductors) where wafers are sawed on scribe lines.

U.S. Pat. No. 5,387,551 (Mizoguchi et al. shows an inductor process and dicing process.

SUMMARY OF THE INVENTION

A principle objective of the invention is to create a high-performance radio-frequency (rf) inductor over the surface of a semiconductor substrate.

Another objective of the invention is to reduce effects of eddy current losses that are typically incurred by an inductor that is created on the surface of a semiconductor substrate.

In accordance with the objectives of the invention a new method and structure is provided for the creation of a semiconductor inductor. Under the first embodiment of the invention, a semiconductor substrate is provided that has been provided with a scribe line in a passive surface region of the substrate and active circuits surrounding the passive region on the surface of the substrate. At least one bond pad is created: on the passive surface of the substrate on each side of the scribe line and in close proximity to the scribe line, this at least one bond pad is connected to interconnect wires that are created on the surface of the substrate. A layer of insulation is deposited over the surface of the substrate, a layer of dielectric is deposited over the layer of insulation, interconnect lines can be created in the layer of dielectric, at least one bond pad is provided on the surface of the layer of dielectric on each side of the scribe line. At least one inductor is created on each side of the scribe line on the surface of the layer of dielectric, this at least one inductor is connected to the at least one bond pad that has been created on the surface of the layer of dielectric on each side of the scribe line. A layer of passivation is deposited over the layer of dielectric, including the surface of the created inductor and the bond pads. The substrate is attached to a glass panel by interfacing the surface of the layer of passivation with the glass panel. The substrate is sawed from the backside of the substrate, the cut that is made by the sawing is aligned with the scribe line that has been provided in the passive surface of the substrate. The silicon that remains in place in the passive surface of the substrate underneath the scribe lines is removed by etching, opening the scribe line up to the surface of the glass panel to which the substrate is attached. By separating the glass panel along the scribe line, separate active units are created that contain active semiconductor devices and at least one inductor. Under the second embodiment of the invention, the inductor is created on the surface of a thick layer of polymer that is deposited over the layer of passivation, the wafer is attached to (laminated to) a tape after which the substrate is separated into individual units.

BRIEF DESCRIPTION OF THE DRAWINGS

FIG. 1 is a cross section of a substrate that has been provided with an active surface region interposed by a passive surface region, the substrate has further been provided with a scribe line that is aligned with the passive surface region of the substrate. A layer of insulation has been deposited over the active surface region of the substrate, at least one bond pad has been created on the surface of the passive surface region of the substrate on each side of the scribe line. A layer of dielectric has been deposited over the layer of insulation partially overlying the passive surface region of the substrate, interconnect lines can be created in or on the surface of the layer of dielectric. At least one contact pad and at least one planar inductor have been provided on the surface of the layer of dielectric on each side of the scribe line. A layer of passivation has been created on the surface of the layer of dielectric.

FIG. 2 shows a cross section after the structure of FIG. 1 has been attached to a glass plate.

FIG. 3 shows a cross section after the backside of the substrate has been cut with a saw.

FIG. 4 shows a cross section after excess silicon has been removed from above the cut provided by the saw.

FIG. 5 shows a cross section after the unit of FIG. 4 has been divided into individual units by die sawing the glass panel.

FIG. 6 shows a cross section of a substrate comprising at least two active surface regions separated by a passive surface region, the active surface region is insulated by a layer of insulation that is deposited over surface of the active devices contained therein. On the surface of the insulating layer a layer of dielectric has been deposited. Interconnect layers are created in or on the surface of this layer of dielectric, a passivation layer has been deposited over the surface of the layer of dielectric, a thick layer of polymer dielectric has been deposited over the layer of passivation. A scribe line has been provided through the layers on the surface of the substrate, at least one bond pad and at least one planar inductor have been formed on the surface of the layer of polymer on each side of the scribe line. The created planar inductor overlies the passive surface region of the substrate.

FIG. 7 shows the cross section of FIG. 6 after it has been attached to a adhesive tape. The substrate has been divided by sawing, creating a cut that is aligned with the scribe line whereby the cut is however wider than the scribe line.

FIG. 8 shows a cross section of the two sections that have been created by the cut as shown in FIG. 7, the two sections of substrate have been removed from the adhesive tape.

DESCRIPTION OF THE PREFERRED EMBODIMENTS

Figure 1:
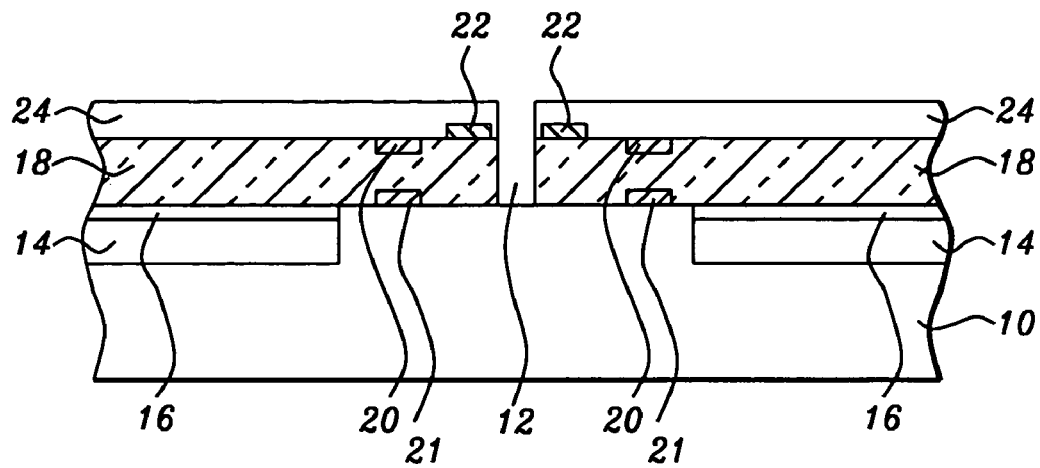
FIGS. 1 through 5 address the first embodiment of the invention, as follows.

In conventional semiconductor processing, active devices are created in or on the surface of a single crystalline silicon substrate. This process of creating semiconductor devices creates multiple devices simultaneously and during one multi-step processing cycle. After the devices have been created in or on the surface of the substrate, the substrate is divided for further processing and packaging of the individual devices. Two approaches can be used for the dividing of a substrate into individual semiconductor devices, that is substrate scribing and substrate sawing.

With substrate scribing, a diamond tipped scribe is moved across the surface of the wafer along pre-formed scribe lines ("streets"). The diamond scribe forms shallow scratches in the surface of the wafer. The wafer is, with the application of pressure to the surface of the wafer, separated along the scribe lines. The fissures (breaks) in the wafer follow the crystal lattice structure of the wafer substrate. Scribing can be used for wafers that are about 10 mils or less in thickness. For thicker wafers, sawing is the preferred method of dicing.

With sawing, a diamond-tipped saw rotating at high rpm contacts and saws the wafer along the streets. Sawing can be performed partially or completely through the wafer. Typically, with saw cutting, the wafer is mounted on a supporting member such as an elastomer adhesive film or a laminated tape that is stretched across a frame.

A number of different approaches have been used to incorporate inductors into a semiconductor environment without sacrificing device performance due to substrate losses. One of these approaches has been to selectively remove (by etching) the silicon underneath the inductor (using methods of micro machining), thereby removing substrate resistive energy losses and parasitic effects. Another method has been to use multiple layers of metal (such as aluminum) interconnects or of copper damascene interconnects.

Other approaches have used a high resistivity silicon substrate thereby reducing resistive losses in the silicon substrate. Resistive substrate losses in the surface of the underlying substrate form a dominant factor in determining the Q value of silicon inductors. Further, biased wells have been proposed underneath a spiral conductor, this again aimed at reducing inductive losses in the surface of the substrate. A more complex approach has been to create an active inductive component that simulates the electrical properties of an inductor as it is applied in active circuitry. This latter approach however results in high power consumption by the simulated inductor and in noise performance that is unacceptable for low power, high frequency applications. All of these approaches have as common objectives to enhance the quality (Q) value of the inductor and to reduce the surface area that is required for the creation of the inductor. The most important consideration in this respect is the electromagnetic energy losses due to the electromagnetic induced eddy currents in the silicon substrate.

FIGS. 1 through 5 address the first embodiment of the invention. It must hereby be pointed out and expressly emphasized that the invention is limited to post-passivation processing. In the following descriptions, the entire process of creating a high-performance rf integrated circuit, including pre-passivation layer deposition, has been highlighted in order to present the complete processing procedure. The invention however limits itself to the processing steps that are performed after a layer of passivation has been deposited over an up-to-that point created structure.

Referring now specifically to FIG. 1, there is shown a cross section of a semiconductor substrate 10 with:

11, the backside of the substrate 10

12, a scribe line; the scribe line has been created through layers overlying the substrate 10 and can reach down to the surface of the substrate 10 or can penetrate into this surface; scribe line 12 is above and approximately centered with respect to the passive region in the surface of substrate 10; the passive surface region of the substrate (not highlighted in FIG. 1) is therefore the surface region of substrate 10 that is interposed between regions 14

14, a layer of active devices in or on the active surface of substrate 10

16, a layer of insulation across the active surface of the substrate 10

18, a layer of dielectric that has been deposited over the surface of the layer 16 of insulation; the layer 18 of dielectric is typically used for the creation of interconnect lines in or on the surface of the layer 18 of dielectric, these interconnect lines are connected (not shown in FIG. 1) to the active devices 14 that have been created in or on the surface of substrate 10 while points of electrical contact (contact pads) are made available on both surfaces of the layer 18 of dielectric 20, the contact pads (bond pads) in the surface of the layer 18 of dielectric, the interconnect lines that are created in or on the surface of the layer 18 of dielectric are connected to contact pads 20

21, contact pads (bond pads) created on the surface of the substrate 19 overlying the passive surface region of the substrate, the interconnect lines that are created in or on the surface of the layer 18 of dielectric are connected to contact pads 21

22, two inductors created on the surface of the layer 18 of dielectric, and 24, a layer of passivation that has been deposited over the surface of layer 18 of dielectric; passivation layer 24 serves the function of preventing ion and environmental contamination of the underlying circuits 14 and interconnect networks that can be created in the layer 18 of dielectric.

The above highlighted processing sequence is not considered part of the invention, as previously highlighted since it has been stated that the invention addresses post-passivation layer aspects of creating a high-performance rf IC.

From the cross section that is shown in FIG. 1, the following can be observed:

the bond pads 21 and 20 and inductors 22 are created on both sides of the scribe line 12 the inductors 22 are created in close proximity to the scribe line 12; this latter is important in view of subsequent processing steps it is assumed (not shown in FIG. 1) that the inductors 22 can be connected to the interconnect lines that are created in or on the surface of the layer 18 of dielectric; more preferably, inductors 22 are connected to bond pads 20.

A protective film of insulation, such as layer 16, can be deposited by plasma CVD using $SiH_3$ gas and $N_2O$ gas at a temperature of 300 to 400 degrees C.

Regarding layer 16 of insulation of FIG. 1, it is preferred that the layer 16 of insulation is a PECVD layer of phosphosilicate (PSG) or borophosphosilicate (BPSG), deposited in a low pressure environment at a chamber pressure of about 0.5 and 10 torr at a temperature of about 300 and 600 degrees C. with reactant gas $SiH_4$ at a flow rate between about 100 and 500 sccm in a diluent carrier gas $PH_3$ at a flow rate between about 20 and 200 sccm. Layer 16 can be deposited to a thickness of between about 300 and 1000 Angstrom.

Layer 18 of dielectric can use any of the conventional dielectrics used in the industry such as for instance silicon dioxide ("oxide", doped or undoped) or silicon nitride ("nitride"), silicon oxynitride, fluoropolymer, parylene, polyimide, tetra-ethyl-ortho-silicate (TEOS) based oxides, boro-phosphate-silicate-glass (BPSG), phospho-silicate-glass (PSG), boro-silicate-glass (BSG), oxide-nitride-oxide (ONO), plasma enhanced silicon nitride (PSiNx), oxynitride. further can be used a low dielectric constant material, such as hydrogen silsesquioxane or HDP-FSG (high-density-plasma fluorine-doped silicate glass) which is a dielectric that has a lower dielectric constant than regular oxide.

The most commonly used and therefore the preferred dielectrics to be used for layer 18 are silicon dioxide (doped or undoped), silicon oxynitride, parylene or polyimide, spin-on-glass, plasma oxide or LPCVD oxide.

The deposition of the layer 18 of dielectric uses conventional deposition technology and can, for instance, be deposited using PECVD procedures at a temperature of between about 350 and 450 degrees C. to a thickness between about 5000 and 10,000 Angstrom using TEOS as a source.

The passivation layer 24 can contain silicon oxide/silicon nitride ($SiO_2/Si_3N_4$) deposited by CVD. Layer 24 can also be a photo-sensitive polyimide or can comprise titanium nitride. Another material that can be used for passivation layer 24 is phosphorous doped silicon dioxide that is typically deposited over a final layer of aluminum interconnect using a Low Temperature CVD process. Silicon nitride can be used for the passivation layer 24 due to its ability to provide an impermeable barrier to moisture and mobile impurities (e.g. sodium ions). Silicon nitride also forms a tough coating that protects underlying structures against mechanical damage. Dependent on further application of the device of the invention, polyimide can be used for passivation layer 24. As a passivation layer, polyimide guards against thin film cracking which frequently results from the packaging of very large dies into plastic packages.

Layer 24 of passivation can be deposited using PECVD technology at a temperature between about 350 and 450 degrees C. with a pressure of between about 2.0 and 2.8 Torr for the duration between about 8 and 12 seconds, deposited to a thickness between about 300 and 1000 Angstrom.

It is of value to once more identify the presence of scribe line 12 in the cross cut that is shown in FIG. 1. The scribe line 12 plays a role in the division of the substrate 10, which will be further discussed below. Suffice it at this time to realize that the scribe line essentially cuts through all layers overlying the surface of the substrate 10 and down to the surface of the substrate 10.

Figure 2:
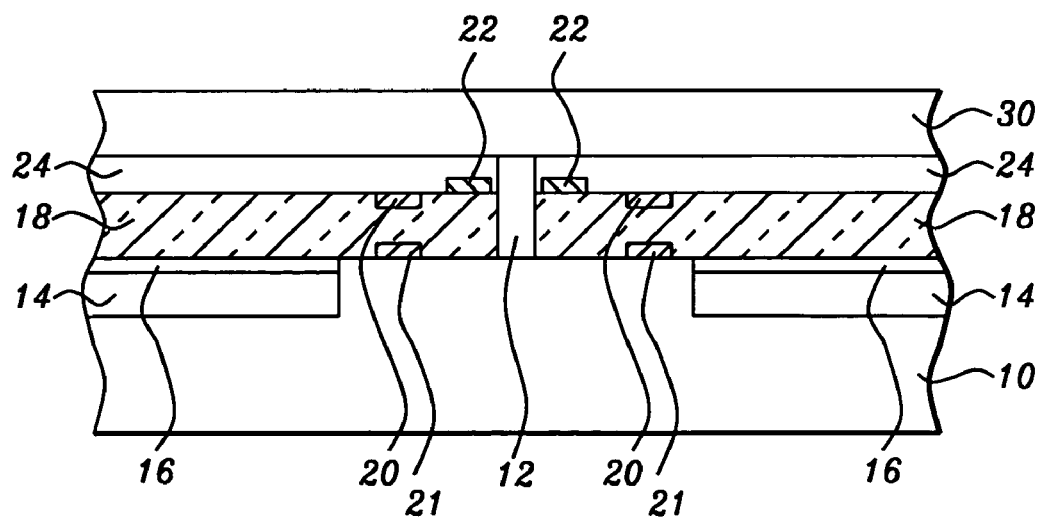

The invention essentially starts with the processing step that is highlighted with the cross section that is shown in FIG. 2, which shows the cross section of FIG. 1 with however the addition of a glass panel 30 to which the construct of FIG. 1 has been attached. The interface between the glass panel 30 and the construct of FIG. 1 is the surface of layer 24 of passivation. The glass panel 30 can be about 200 μm thick. The attachment to the glass panel 30 can be achieved be coating an adhesive layer over the surface of the panel, pressing the construct of FIG. 1 against this adhesive layer will result in attaching the construct of FIG. 1 to the glass panel.

Figure 3:
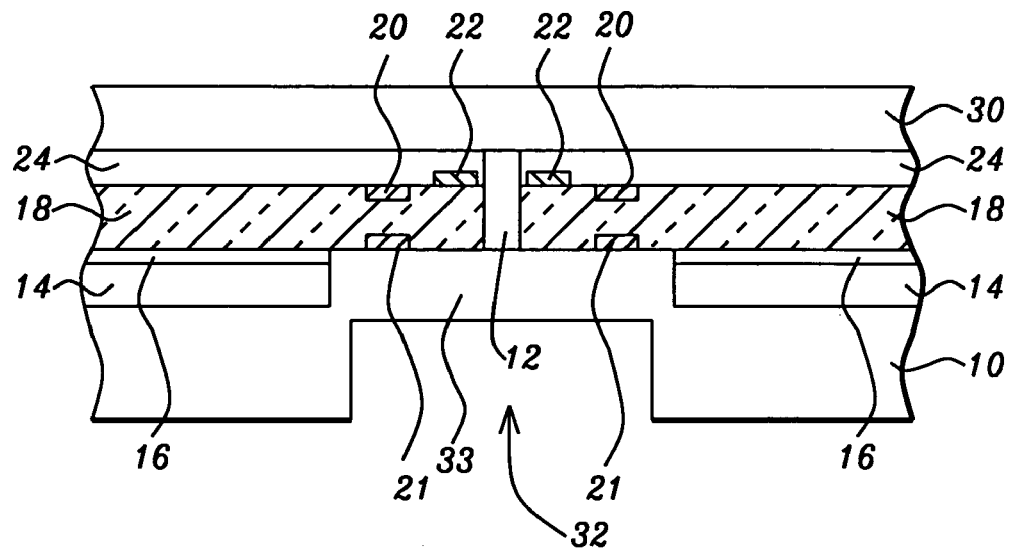

FIG. 3 shows the same cross section as has been shown in FIG. 2 with the exception of a deep indentation or cut 32 that has been made into the surface of the substrate, approaching the substrate from the backside 11. It must be noted that this cut aligns with the scribe line 12 but does not penetrate the substrate to the scribe line 12. There remains, in other words, after cut 32 has been created, silicon material 33 present between the bottom or deepest penetration of the cut 32 and the scribe line 12. This remaining silicon 33 has a thickness of about 10 μm and is removed by the processing step of etching the silicon 33, FIG. 4.

Substrate 10 can be etched from the backside 11 using a wet etchant. One suitable wet etchant for a wafer that is formed of monocrystalline silicon is a solution containing a mixture of KOH (potassium hydroxide) and $H_2O$. This solution anisotropically etches the silicon substrate 10, forming grooves in the substrate having sidewalls that are sloped at an angle of about 54 degrees with the horizontal. The slope of the sidewalls is a function of the different etch rates of monocrystalline silicon along the different crystalline orientations.

Another method that can be used to etch the substrate 10 in the area 33 (FIG. 3) is the use of RIE dry etching.

Figure 4:
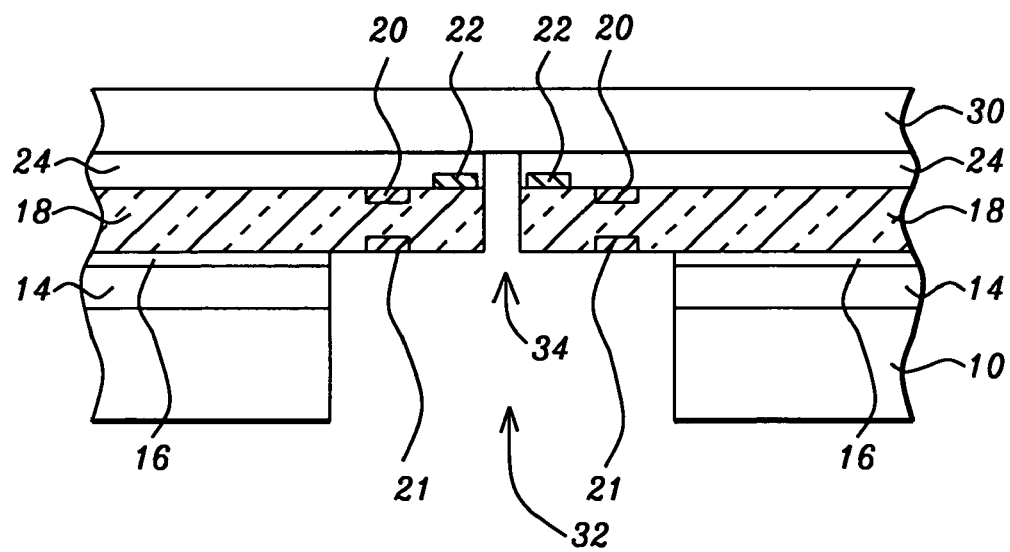

It must be noted in FIG. 4 that the removal of the silicon 33 of the passive surface region of substrate 10 exposes bond pads 21 that previously have been created in the surface of the passive surface region of the substrate 10. These bond pads 21 are therefore available for further interconnecting of active devices of layers 14 and the planar inductors 22.

It must further be noted in FIG. 4 that the inductors 22 are aligned with the opening 32 that has been sawed into the backside 11 of the substrate 10. This is of importance in view of the previously stated objective of reducing eddy currents that are typically induced in the surface of the substrate 10 by the presence of the inductors 22. With the inductors 22 no longer overlying the surface of the silicon, since this silicon has been removed by the combined processes of sawing and etching, the objective of reducing the eddy currents in the silicon has been achieved and, with that, the objective of creating high-Q inductors for high-performance rf circuits.

Figure 5:
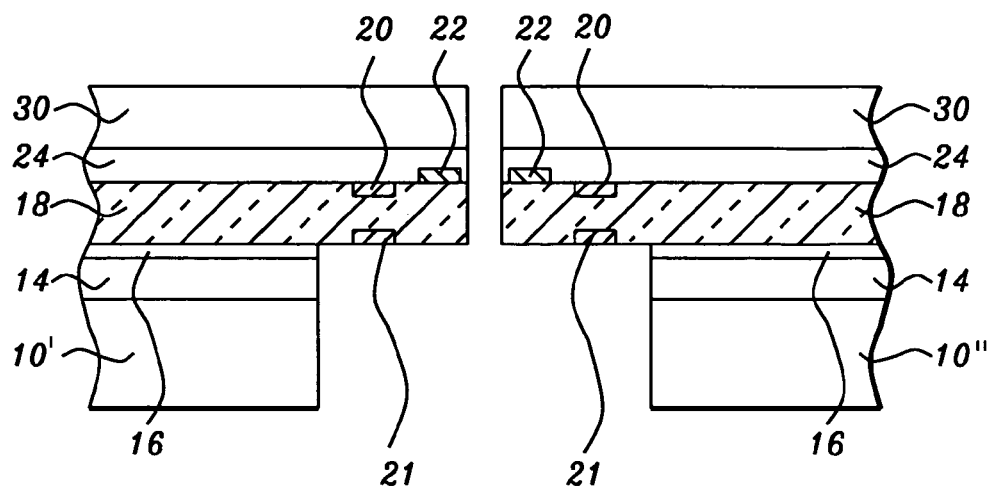

FIG. 5 shows the final cross section of the first embodiment of the invention, whereby the substrate 10 has been divided into two individual units 10' and 10" by sawing the glass panel 30 in alignment with the scribe line 12. It has previously been highlighted that the inductors 22 have been created in close proximity to the scribe line 12, the inductors 22 as a consequence are overlying layer 16 of dielectric and are no longer deposited over a layer of silicon (of the silicon substrate 10). Inductors 22 are therefore high-Q inductors that can be used for high-performance rf applications.

A further and basic observation relating to FIG. 5 can be made in view of the fact that the design parameters (such as the width of the cut 32, FIG. 3) can be selected. The width of the opening that is created in the backside of the substrate 10 can be adjusted and can be made adequately large so that, after the process of FIG. 5 has been completed, the inductors 22 are even further removed from the silicon over which the layers of insulation and the like have been deposited. The further the inductors are removed from the silicon of the substrate, the less electromagnetic coupling between the inductors and the substrate will occur, the further eddy currents in the silicon will be reduced, the more the Q factors of the inductor will be increased.

After the structure that is shown in cross section in FIG. 5 have been created, theses structures can be further processed by interconnecting bond pads 21 to the surrounding circuitry, thus interconnecting the active devices 14 that have been created in or on the surface of substrate 10 and the inductors 22 to the surrounding circuitry.

Figure 6:
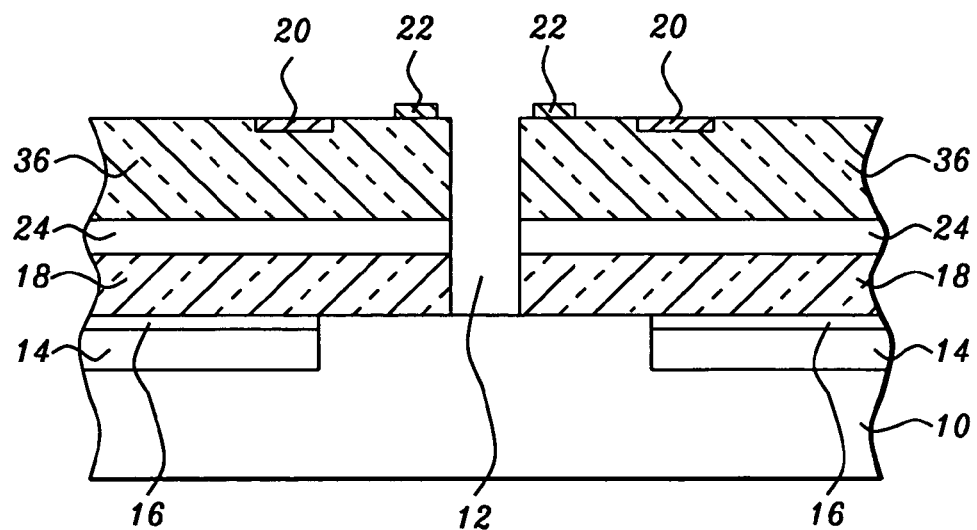
FIGS. 6 through 8 address the second embodiment of the invention, as follows.
Figure 7:
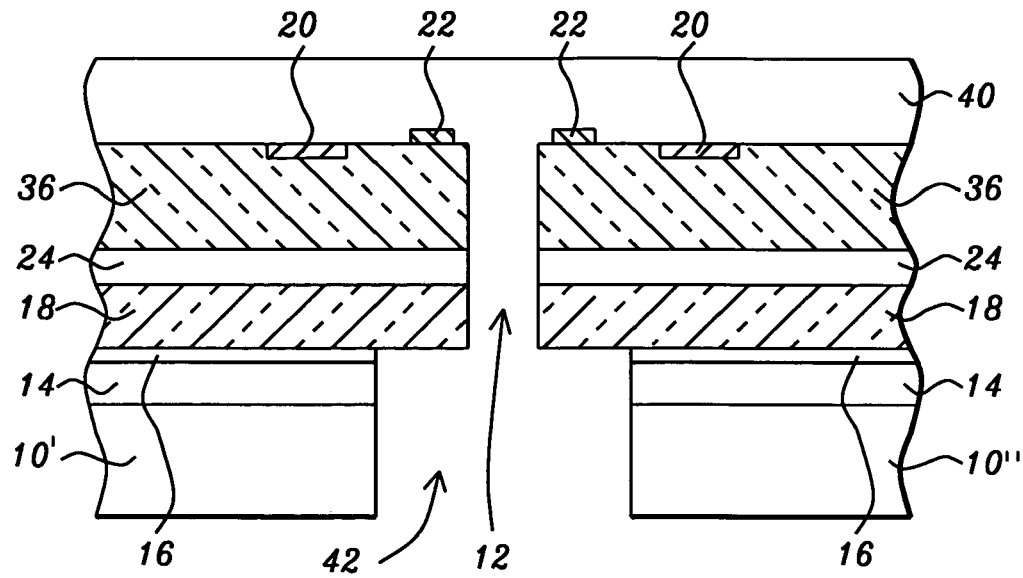
Figure 8:
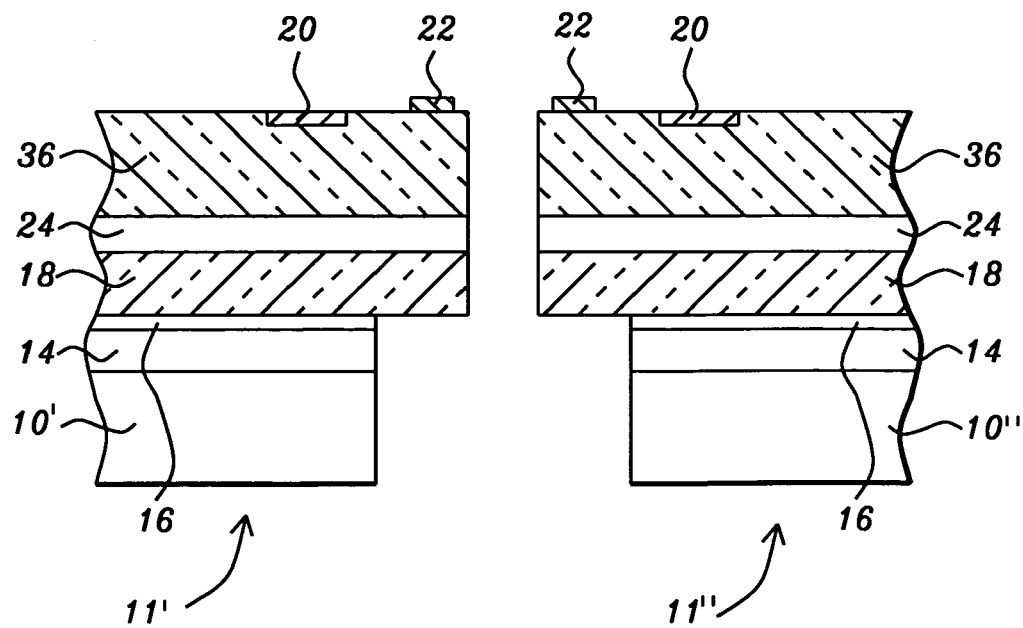

FIGS. 6 through 8 address the second embodiment of the invention. Most of the processing conditions and materials used that apply to the second embodiment of the invention have been highlighted under the first embodiment of the invention and will therefore not be repeated at this time. These processing conditions and the materials that can be used for the various layers that are deposited over the surface of the substrate equally apply to the first and the second embodiment of the invention.

Referring now specifically to FIG. 6, there is shown in cross section a number of elements, some of the elements have previously been highlighted. Shown in cross section in FIG. 6 are:

11, the backside of the substrate 10

12, a scribe line; the scribe line has been created through layers overlying the substrate 10 and can reach down to the surface of the substrate 10 or can penetrate into this surface 14, a layer of active devices in or on the active surface of substrate 10; layers 14 are separated by the passive surface region (not highlighted) in the surface of substrate 10

16, a layer of insulation across the active surface of the substrate 10

18, a layer of dielectric that has been deposited over the surface of the layer 16 of insulation; the layer 18 of dielectric is typically used for the creation of interconnect lines in or on the surface of the layer 18 of dielectric, these interconnect lines are connected (not shown in FIG. 6) to the active devices 14 that have been created in or on the surface of substrate 10 while points of electrical contact (contact pads) are made available on the surfaces of layer 18

24, a layer of passivation that has been deposited over the surface of the layer 18 of dielectric; the invention starts after the deposition of the layer 24 of passivation 36, a thick layer of a polymer dielectric that has been deposited over the surface of the layer 24 of passivation 20, contact pads (bond pads) in the surface of the layer 36 of polymer dielectric, the interconnect lines that are created in or on the surface of the layer 18 of dielectric can be connected to contact pads 20

22, two inductors that have been created on the surface of the layer 36 of polymer dielectric.

The polymer ($SiCl_xO_y$) layer 36 can be spun onto the surface of the passivation layer 24 and can contain but is not limited to silicons, carbons, fluoride, chlorides, oxygens, parylene, teflon, polyimide, BCB, polycarbonate (PC), polystyrene (PS), polyoxides (PO), polymethylmethacrylate (PPMA) and polypolyoxides (PPO). It is important to use a material for the polymer film that can be applied by spin coating or lamination.

The layer 36 of polymer is typically formed to a thickness of between about 5,000 and 30,000 Angstrom.

To further enhance the functionality of the thick layer 36 of polymer, this layer can be cured after it has been formed. Curing can be performed at a temperature between about 250 to 450 degrees C. for a time between about 0.5 to 1.5 hours and can be performed in a vacuum or nitrogen ambient.

FIG. 7 shows the cross section of FIG. 6 after:

the structure of FIG. 6 has been attached to a flexible tape 40, the interface between the flexible tape 40 and the structure of FIG. 6 is the surface of the thick layer 36 of polymer dielectric the substrate 10 has been cut, using a saw, approaching the substrate 10 from the backside 11 and creating an opening 42 into the backside 11 of the substrate 10. Opening 42 aligns with the scribe line 12 and penetrates the substrate essentially to the scribe line 12, thus separating the substrate 10 into two sections 10' and 10".

FIG. 8 shows a cross section of the two units 11' and 11" after the two units 11' and 11" have been removed for tape 40 (FIG. 7). The removal of the tape 40 exposes the inductors 22 while bond pads 20 are available for further interconnection of the units 11' and 11" to surrounding circuits or as part of a semiconductor package.

The structures that are shown in cross section in FIG. 8 indicate that the inductors 22 are:

not overlying the silicon of the silicon substrate layers 10' and 10"

further removed from the underlying silicon substrate 10' and 10" by the thickness of the layer 36 of polymer dielectric.

The first of these two items results in a significant decrease of the eddy currents that are typically induced by overlying inductors in the underlying silicon substrate. The second of these items removes the created inductor further from the surface of the underlying substrate, thus reducing the strength of the electromagnetic field that penetrates the underlying silicon substrate, thus further reducing the effect of electromagnetic losses in the surface of the substrate.

The structures that are shown in cross section in FIG. 8 can be further processed for conventional packaging of these structures.

The various layers such as layers of insulation and dielectric that have been discussed are provided with interconnect vias and with layers of interconnect lines that are created on the surface of these layers. To further highlight this, these details are indicated in FIG. 9, FIG. 9 addresses the first embodiment of the invention, is based on FIG. 5 and provides additional detail relating to interconnect vias and interconnect lines created on the various surfaces.

Figure 9:
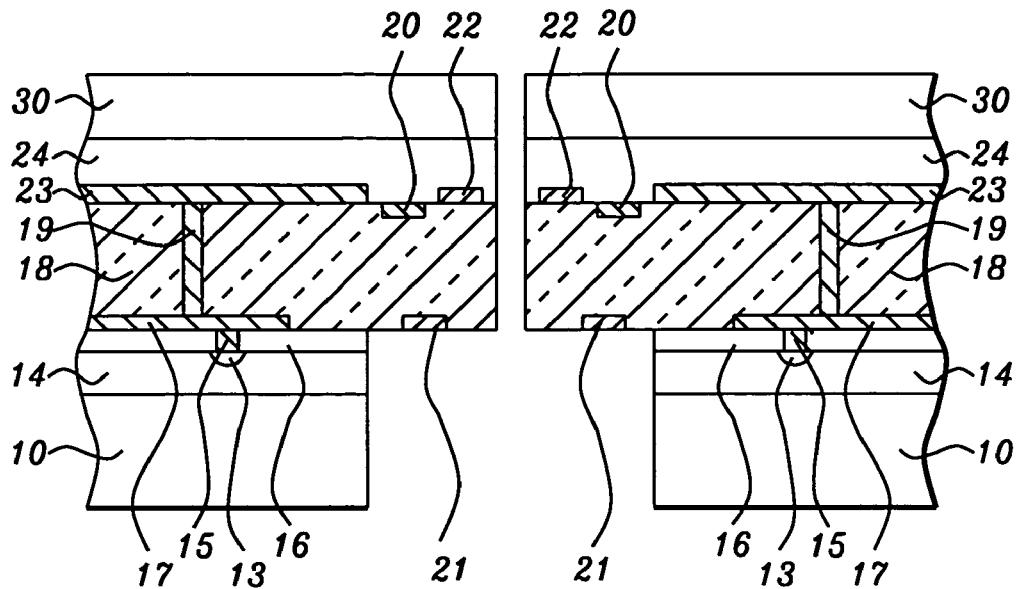
FIG. 9 shows details relating to the creation of conducting interconnects for the first embodiment of the invention.

Most of the elements that are shown in FIG. 9 have been highlighted in FIGS. 1 though 5 and therefore need not be repeated at this time.

The not previously highlighted elements that are shown in FIG. 9 are:

13, a point of electrical contact in the surface of substrate 10 to which active devices created in layer 14 are connected

15, an opening or via created in layer 16 of insulation through which point 13 can be electrically accessed

17, interconnect lines that can be created in or on the surface of layer 16 of insulation; these interconnect lines 17 can be connected to the active devices in layer 14 by means of via 13

19, a via through the layer 18 of dielectric

23, interconnect lines that can be created in or on the surface of layer 18 of dielectric; these interconnect lines 23 can be connected to the active devices in layer 14 by means of via 19, interconnect lines 17 and via 15.

Further, contact pads 20 can be connected to interconnect lines 23; the planar inductors 22 can also be connected to the interconnect lines 23. More preferably, planar inductors 22 are connected to contact pads 20.

Figure 10:
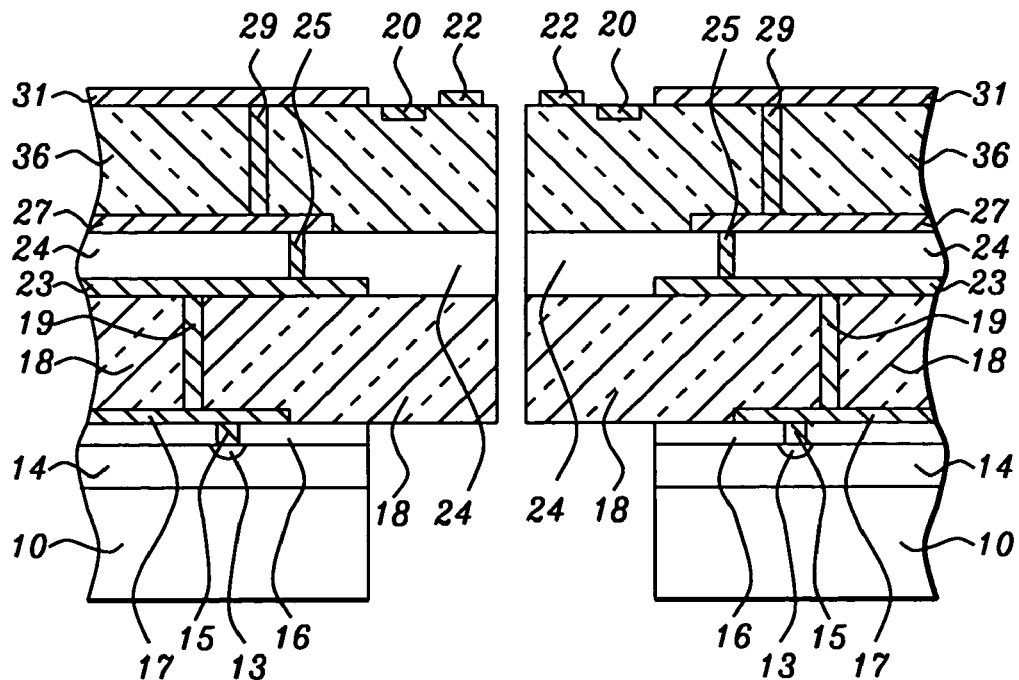
FIG. 10 shows details relating to the creation of conducting interconnects for the second embodiment of the invention.

FIG. 10 relates to the second embodiment of the invention, that is to FIGS. 6-8. FIG. 10 is based on FIG. 8 and provides additional detail relating to interconnect vias and interconnect lines created on the various surfaces.

New elements that have been added to FIG. 10 are:

25, interconnect vias that can be created through the layer 24 of passivation

27, interconnect lines that can be created in or on the surface of passivation layer 24

29, interconnect vias that can be created through the layer 36 of polymer, and

31, interconnect lines that can be created on the surface of layer 36 of thick polymer.

The use of the term "via" or "vias" for the description of the interconnecting elements through layers of dielectric and the like as shown in FIGS. 9 and 10 does not imply that these via(s) are created as separate conducting plugs, prior to and independent of the creation of an overlying network of interconnect lines. For many applications, the interconnection between overlying conducting layers, such as layers 17 and 23 of FIG. 9, can be created creating an opening in the underlying layer, such as layer 18, depositing a layer of conducting material over the underlying layer which fills the opening with a conducting material at the same time that this conducting material is deposited (for further patterning and etching, forming interconnect lines) on the surface of the underlying layer. For instance, vias 19 can be filled with a conducting material by depositing, after openings for vias 19 have been created in layer 18, the conducting layer 23.

Vias 25 can be connected to interconnect lines 23, vias 29 can be interconnected with interconnect lines 27, bond pads 20 can be connected to interconnect lines 31, planar inductors 22 can be connected to interconnect lines 31 but will more preferably be connected to bond pads 20. All other elements that are shown in FIG. 9 have previously been highlighted under either FIG. 9 or FIGS. 6 through 8.

The method of the invention for fabricating a planar inductor in high-performance, high-frequency semiconductor circuits can be summarized as follows:

providing a substrate having a first and a second surface, active devices with conductive interconnects being covered by a layer of passivation having been created over the surface of the substrate divided by a scribe line;

forming a thick layer of a polymer dielectric over the surface of the layer of passivation divided by the scribe line;

creating at least one planar inductor on the surface of the thick layer of a polymer dielectric on each side of the scribe line, the at least one planar inductor overlying the passive surface region of the substrate;

creating at least one bond pad on the surface of the thick layer of a polymer dielectric on each side of the scribe line, the at least one planar inductor overlying the passive surface region of the substrate attaching an adhesive tape to the surface of the thick layer of a polymer dielectric;

cutting the first surface of the substrate, the cutting being aligned with a passive region in the second surface of the substrate, the cutting partially penetrating through the substrate, the cutting creating a relatively wide cut in the first surface;

wet or dry etching the first surface of the substrate, removing the remainder of the substrate material; and removing the adhesive tape from the surface of the thick layer of a polymer dielectric.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A semiconductor wafer comprising:
   a semiconductor substrate;
   an active-device region in or on said semiconductor substrate;
   a dielectric layer over said semiconductor substrate and over said active-device region; and
   a passive device over said dielectric layer, wherein the shortest distance between said passive device and a scribe line of said semiconductor wafer is less than that between said active-device region and said scribe line.

2. The semiconductor wafer of claim 1 further comprising a passivation layer over said semiconductor substrate, wherein said passive device is under said passivation layer.

3. The semiconductor wafer of claim 2, wherein said passivation layer comprises silicon nitride.

4. The semiconductor wafer of claim 1, wherein said passive device comprises an inductor.

5. The semiconductor wafer of claim 1 further comprising a bond pad over said semiconductor substrate, wherein the shortest distance between said passive device and said scribe line is less than that between said bond pad and said scribe line.

6. The semiconductor wafer of claim 1 further comprising a passivation layer over said semiconductor substrate, wherein said passive device is over said passivation layer.

7. The semiconductor wafer of claim 6 further comprising a polymer layer between said passive device and said passivation layer.

8. The semiconductor wafer of claim 7, wherein said polymer layer comprises polyimide.

9. The semiconductor wafer of claim 6 further comprising a first interconnect line under said passivation layer and a second interconnect line over said passivation layer, wherein said first and second interconnect lines are connected to each other.

10. The semiconductor wafer of claim 1, wherein said dielectric layer comprises silicon oxide.

11. A semiconductor wafer comprising:
    a semiconductor substrate;
    an active-device region in or on said semiconductor substrate; and
    an inductor over said semiconductor substrate, wherein the shortest distance between said inductor and a scribe line of said semiconductor wafer is less than that between said active-device region and said scribe line.

12. The semiconductor wafer of claim 11 further comprising a passivation layer over said semiconductor substrate, wherein said inductor is under said passivation layer.

13. The semiconductor wafer of claim 12, wherein said passivation layer comprises silicon nitride.

14. The semiconductor wafer of claim 11 further comprising a bond pad over said semiconductor substrate, wherein the shortest distance between said inductor and said scribe line is less than that between said bond pad and said scribe line.

15. The semiconductor wafer of claim 11 further comprising a passivation layer over said semiconductor substrate, wherein said inductor is over said passivation layer.

16. The semiconductor wafer of claim 15 further comprising a polymer layer between said inductor and said passivation layer.

17. The semiconductor wafer of claim 16, wherein said polymer layer comprises polyimide.

18. The semiconductor wafer of claim 15 further comprising a first interconnect line under said passivation layer and a second interconnect line over said passivation layer, wherein said first and second interconnect lines are connected to each other.

* * * * *